United States Patent [19]

Rippel

[11] Patent Number: 4,884,631
[45] Date of Patent: Dec. 5, 1989

[54] FORCED AIR HEAT SINK APPARATUS

[75] Inventor: Wally E. Rippel, Altadena, Calif.

[73] Assignee: California Institute of Technology, Pasadena, Calif.

[21] Appl. No.: 170,378

[22] Filed: Mar. 17, 1988

[51] Int. Cl.$^4$ .................. F28F 3/02; H01L 23/36
[52] U.S. Cl. .................. 165/185; 174/16.3; 357/82; 361/384
[58] Field of Search ............... 165/80.3, 185; 174/16.3; 357/82; 361/384

[56] References Cited

U.S. PATENT DOCUMENTS

| 3,180,404 | 4/1965 | Nelson et al. | 165/185 |
| 3,592,260 | 7/1971 | Berger | 165/21 |
| 4,270,604 | 6/1981 | Nakamura | 165/185 |
| 4,345,643 | 8/1982 | Dawson et al. | 165/122 |
| 4,777,560 | 10/1988 | Herrell et al. | 361/384 |

OTHER PUBLICATIONS

IBM Tech. Discl. Bulletin, "High Performance Air—Cooled Module", vol. 28, No. 7, Dec. 1985, pp. 3058-3059.

Primary Examiner—Martin P. Schwadron
Assistant Examiner—Allen J. Flanigan
Attorney, Agent, or Firm—Leonard Tachner

[57] ABSTRACT

A high efficiency forced air heat sink assembly employs a split feed transverse flow configuration to minimize the length of the air flow path through at least two separated fin structures. Different embodiments use different fin structure material configurations including honeycomb, corrugated and serpentine. Each such embodiment uses a thermally conductive plate having opposed exterior surfaces; one for receiving a component to be cooled and one for receiving the fin structures. The serpentine structured fin embodiment employs a plurality of fin supports extending from the plate and forming a plurality of channels for receiving the fin structures. A high thermal conductivity bondant, such as metal-filled epoxy, may be used to bond the fin structures to either the plate or the fin supports. Dip brazing and soldering may also be employed depending upon the materials selected.

12 Claims, 3 Drawing Sheets

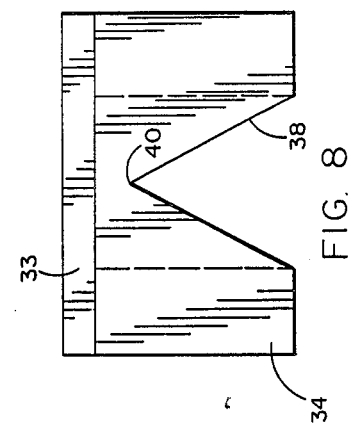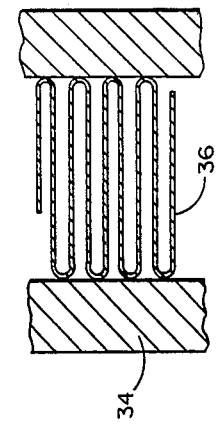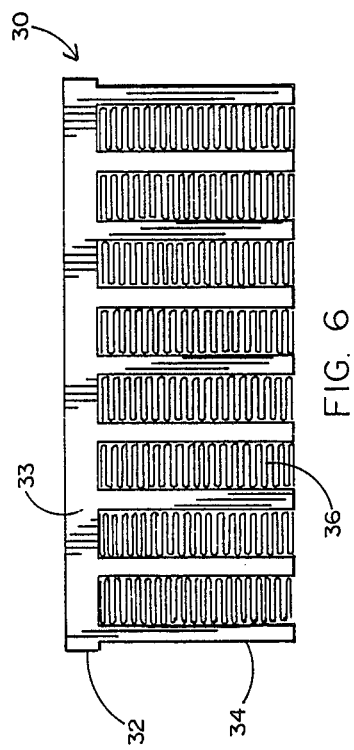

FORCED AIR HEAT SINK APPARATUS

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

The present invention relates generally to heat sinks for aiding in the cooling of semiconductors, power conditioners, motor drives, inverters and other electromechanical and electronic components and more specifically, to a low-cost heat sink for use with forced air and having a high fin area and a short fin length which eliminates the need for an air manifold or baffle.

BACKGROUND ART

In electronic power systems, heat produced by power semiconductors must be rejected to ambient air by a suitable heat dissipating subsystem. In applications where a semiconductor device dissipates only a few Watts, finned structures cooled by free air convection provide suitable cooling means. However, at higher levels of dissipation, such as 100 Watts and above, such methods of heat transfer become ineffective. On the other hand, for devices which dissipate on the order of 1,000 Watts, fluid cooled systems must usually be resorted to in order to provide adequate cooling at such high power dissipations. At such high power levels, fluid cooling is a requirement despite added complexity, high initial cost, reduced reliability and added maintenance costs. At power dissipation levels between approximately 100 Watts and 1,000 Watts, forced air cooled finned structures are generally used. Ideally, such structures include large numbers of closely spaced fins of small thickness and short length. Thus far however, fabrication costs have precluded general use of such ideal fins and conventional extruded structures have prevailed where fin thickness, spacing and orientation are all constrained to non-optimal values. The net result is that the present forced air heat sinks are often ten-fold more massive than their ideal counterparts. The size and mass penalties in turn yield multiplied penalties at the system level. There is therefore a long felt need for providing a low-cost heat sink structure for use in a forced air environment and preferably one which eliminates the need for any form of air manifold or baffle and which is capable of more closely approaching optimal physical parameters for use in the power dissipation range of approximately 100 Watts to 1,000 Watts.

STATEMENT OF INVENTION

The present invention solves the aforementioned longfelt need by providing a low cost heat sink for use in forced air systems preferably in systems which require power dissipation of from 100 to 1,000 Watts. The power dissipation capabilities of the heat sink of the present invention are substantially superior to those of the prior art. Thus for example, the system of heat sinking provided by the present invention is far more efficient than free air fin structures which cannot operate favorably at the dissipation levels required in the 100 Watt to 1,000 Watt range. In addition, the heat sink of the present invention is far more reliable and far less complex and costly as compared to fluid cooled systems of the prior art. Perhaps most importantly, the present invention provides a forced air fin structure of a novel configuration having a high fin area and a short fin length which more closely approaches optimal parameters for a forced air fin structure than the prior art. More specifically, for optimal power dissipation in a forced air fin structure, the air flow path between inlet and outlet should be minimized. As this is done, the air flow cross section automatically increases while the flow velocity is reduced.

A second requirement for optimality is that fin spacing be selected to correspond to the pressure characteristics of the air flow source. Thus for example, spacings greater than such correspondence increase thermal impedance to reduced fin area while smaller spacings increase thermal impedance due to reduced air flow. Another requirement for optimality is that fin thickness be selected to provide the optimal compromise between thermal gradient in the fin and restriction of air flow. Fin thickness less than optimal, results in increased thermal impedance due to fin gradient while fin thickness greater than optimal results in degraded thermal impedance due to reduced air flow. Based on the criteria of minimizing flow length, the novel structure of the present invention utilizes a split feed transverse flow heat sink configuration where air flow enters the structure through a slot and is then divided into two flow paths, one flowing through each of two separate fin structures. Air flow is preferably maintained by a fan or blower mounted in an enclosure in which the heat sink of the present invention is also mounted.

Three different embodiments of the invention are disclosed herein, each of which uses this novel split feed transverse flow configuration but with different fin structures and each of which is designed to contribute to thermal efficiency while providing mechanical stability. The three fin structure embodiments disclosed herein comprise a honeycomb structure, a corrugated fin structure and a serpentine fin structure. In the first two such embodiments a primary structure comprising a solid metal plate is used as a thermal interface between the fin structure and the device being cooled by the present invention. In the third embodiment, the primary structure also comprises a series of perpendicularly oriented fingers which provide mechanical stability for the serpentine fin structure yielding a structure which is similar in appearance to an automobile radiator. In each such embodiment the high fin area and short fin length permit the use of a smaller mass and volume while the split feed transverse flow configuration eliminates the usual prior art need for either air manifolds or baffles to guide the air flow through the heat sink. The enclosure and heat sink combination of the present invention eliminates the need for air ducting. In addition, a single blower may be used with a multiplicity of such heat sinks. Furthermore, air flow within an enclosure may be used to cool components other than those mounted on the heat sink. Thermal impedance is uniform over the heat sink of the present invention while conventional structures often have a large gradient over the heat sink surface particularly in the direction of air flow. The present invention also permits unlimited scale-up perpendicular to the air flow direction as thermal impedance per unit length remains constant. In addition, the optimal thermal characteristics of the present invention provide at least an order of magnitude improvement in heat sink size permitting the mounted electronic devices, such as power semiconductor modules, to be more closely spaced thereby reducing cable length inductance as well as the size of the enclosure. There is also a significant reduction in size of the present invention for a given thermal dissipation which permits integrating the heat sink with the electronic module being cooled. Such integration is generally impractical using prior art heat sinks where the size of the heat sink is so much greater than the module being cooled.

OBJECTS OF THE INVENTION

It is therefore a principal object of the present invention to provide a novel forced air heat sink designed to provide a split feed transverse flow configuration to significantly improve thermal dissipation efficiency by minimizing air flow path while increasing air flow cross section and reducing air flow velocity.

It is an additional object of the present invention to provide an improved forced air heat sink for use with devices which must dissipate power levels in the range of 100 to 1,000 Watts each and which utilizes a split feed transverse flow configuration which eliminates the usual requirement for air ducting such as manifolds and baffles.

It is still an additional object of the present invention to provide an improved high performance forced air heat sink especially adapted for operation with electrical devices such as power semiconductor modules which dissipate power in the range of 100 to 1,000 Watts each and which utilizes a novel split feed transverse flow configuration where the structure automatically divides the air flow with half flowing through each of two separated fin structures.

It is still a additional object of the present invention to provide an improved forced air heat sink where thermal impedance is substantially uniform over the heat sink surface in the direction perpendicular to air flow thereby permitting unlimited scale-up in this direction.

It is still an additional object of the present invention to provide an improved high efficiency forced air heat sink having a novel split feed transverse flow configuration having optimal selected fin spacing and thickness in a mechanically stable configuration such as by using fin structures having a honeycomb, corrugated or serpentine configuration.

BRIEF DESCRIPTION OF THE DRAWINGS

The aforementioned advantages and objects o the present invention as well as additional advantages and objects thereof will be more fully understood hereinafter as a result of a detailed description of preferred embodiments when taken in conjunction with the following drawings:

FIG. 6 is a front view of a third embodiment of the present invention similar to that of FIG. 3 but illustrating the serpentine fin structure thereof;

FIG. 7 is a bottom view of the third embodiment of the invention illustrated in FIG. 6;

FIG. 8 is a side view of the third embodiment of FIG. 6; and

FIG. 9 is an enlarged detailed view of a portion of the embodiment of FIG. 6 illustrating specific interface between the serpentine fin structure and the primary structure thereof.

DETAILED DESCRIPTION OF THE INVENTION

Figure 1:
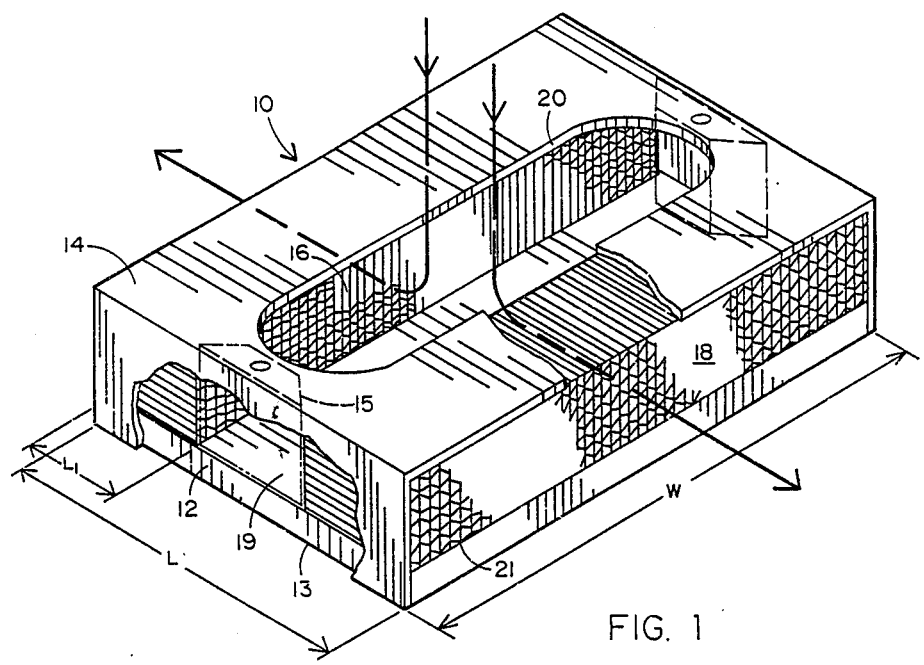
FIG. 1 is an isometric representation of a heat sink structure in accordance with the present invention.

Referring first to FIG. 1 it will be seen that the heat sink assembly 10 of the present invention comprises a top plate 12 having a component mounting surface 13 and a cover plate 14. Top plate 12 and cover plate 14 together comprise a substantially rectangular structure into which is bonded a first fin structure 16 and a second fin structure 18. Mounting posts 15 are provided to secure cover plate 14 to the assembly. It will be understood that the heat sink 10 shown in FIG. 1 is shown oriented in an inverted configuration relative to its normal configuration with top plate 12 above the fin structures 16 and 18 to receive a component on the mounting surface 13. This inverted configuration is shown in FIG. 1 purely for purposes of describing the structure of the present invention.

It will be seen further in FIG. 1 that first fin structure 16 and second fin structure 18 are affixed to the top plate 12 on the surface opposite mounting surface 13 in parallel spaced apart relation leaving an elongated gap 19 therebetween. It will be seen further in FIG. 1 that the cover plate 14 is provided with an elongated inlet 20 which is generally aligned with gap 19 and which permits air flow into gap 19 where the flow is then divided, half flowing through each of the separate fin structures 16 and 18 in the manner shown schematically in FIG. 1. A thermally conductive bondant 21, such as a metal filled epoxy, is used to bond the fin material to the top plate.

Figure 2:
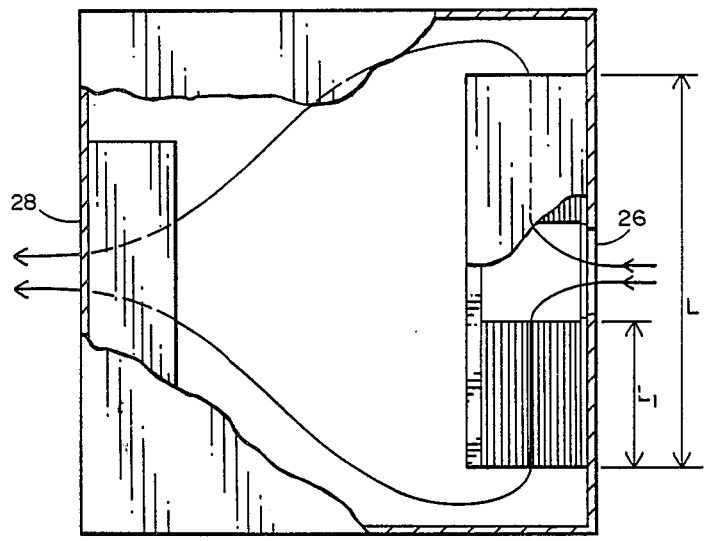
FIG. 2 is a side elevational view of the heat sink of the present invention shown within an air flow enclosure.
Figure 3:
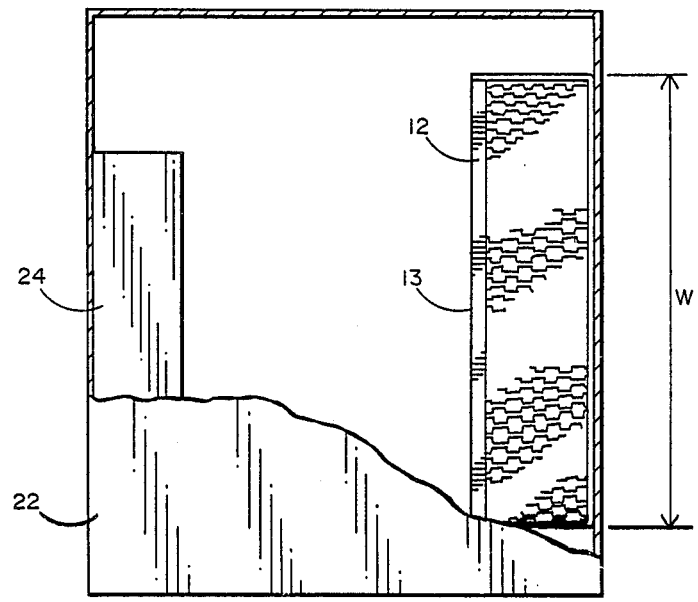
FIG. 3 is a front view of the enclosure and heat sink shown in FIG. 2.

The heat sink assembly 10 of the present invention may be advantageously utilized within a component enclosure 22 as seen best in FIGS. 2 and 3. The enclosure 22 is preferably provided with an inlet 26 which is preferably located in juxtaposition to air inlet 20 of the heat sink assembly 10 in the manner shown in FIG. 2 and an outlet 28 is preferably positioned opposite the heat sink assembly 10 adjacent a blower 24. Air enters the enclosure 22 through the bottom inlet 26 and the heat sink assembly air inlet 20 and then divides with about half of the air flow being directed through each of the separate fin structures 16 and 18. Air flow is maintained by the blower 24 mounted in the enclosure 22 as shown best in FIG. 3. Reverse air flow may also be affected and may be advantageously used in many circumstances. Those having skill in the art to which the present invention pertains will readily appreciate the numerous advantages of the split feed transverse flow configuration of FIG. 1 particularly as it is used in a component enclosure 22 as shown in FIGS. 2 and 3. It will be observed that there is, because of the split feed configuration, a short air flow path L1 which is significantly shorter than the total air flow traversal path L that would otherwise be encountered if the air flow through heat sink assembly 10 were from one side to the other as in a conventional prior art heat sink assembly. Furthermore, because of the split configuration of the present invention, structures for air ducting such as manifolds or baffles are not required because this function is provided by the shape of the heat sink assembly and the combination of the enclosure and the heat sink. Furthermore, a single blower may be used with a plurality of such heat sink assemblies. Additional air flow within the enclosure 22 may be used to cool components other than those mounted on the top plate 12. Thermal impedance is uniform over the heat sink surface while conventional heat sink structures tend to have a large thermal gradient along the W direction as seen in FIG. 1. Furthermore, unlimited scale-up in the W dimension is accommodated because thermal impedance per unit length remains constant.

Figure 4:
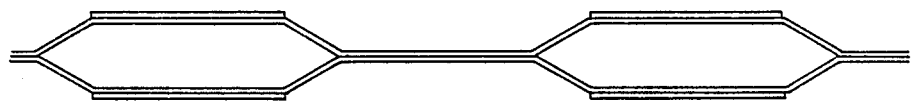
FIG. 4 is an enlarged view of the honeycombed structure of a first embodiment of the fin structure of the present invention.
Figure 5:
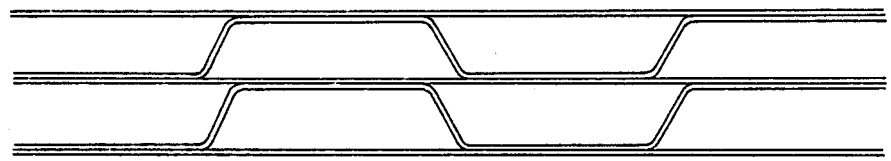
FIG. 5 is an enlarged view of the corrugated structure of a second embodiment of the fin structure of the present invention.

Optimal fin thickness and spacing are relatively small. Fin thicknesses and spacing range from 0.003 to 0.008 inches and from 0.020 to 0.050 inches, respectively. These dimensions are generally far too small to make extrusion of the fin structures a viable fabrication technique. However, because of these very small dimensions in thickness and spacing, reinforcement is required to give the fin structure mechanical stability. Accordingly, it is preferable to utilize low cost production materials which can meet both dimensional and mechanical requirements for the fin structures. One such material, which comprises the first embodiment of the present invention illustrated in FIG. 4, is aluminum honeycomb. In its usual structural form aluminum sheets are striped with an adhesive and then expanded to form adjoining hexagonal cells. For the heat sink application, conventional fabrication processes apply but with changes in the dimensional parameters. An alternative fin structure material is illustrated in FIG. 5. This material is composed of multiple corrugated sheets which are alternately bonde with non-corrugated sheets. Use of either material shown in FIGS. 4 and 5 results in a fin structure which is mechanically rugged due to the large number of bonding points. With each material, fabrication costs are relatively low and control of fin spacing and fin thickness is easily achieved. It will be noted that the first and second embodiments of the present invention differ only in the detailed geometry of the fin structure, but are essentially identical in all other respects conforming substantially to the conceptual illustration of FIG. 1. However, a third embodiment of the invention, which is disclosed in FIGS. 6-9, differs from the first two embodiments not only in fin structure but also in the primary structure which supports the fin material.

Acordingly, referring now to FIGS. 6-9 it will be seen that the third embodiment heat sink assembly 30 of the present invention comprises a primary structure 32 which includes a top plate 33 similar to that of FIG. 1, but which also includes a plurality of fin supports 34 which extend integrally from and perpendicular to the top plate 33 to form a plurality of vertical channels. Plate 33 and supports 34 may, for example, be made of copper or aluminum. Between these vertical channels are located a like plurality of fin structures 36 which as seen best in FIG. 9 comprise a long, thin copper or aluminum sheet material which is configured in a serpentine pattern starting in immediate juxtaposition to the top plate 33 and extending vertically to the lower ends of the fin supports 34. As seen best in FIG. 7, there are two such serpentine wound sets of fin structures, one on each side of the assembly 30. Thus, this third embodiment also incorporates the novel split feed transverse flow configuration of FIG. 1. However, in addition, in order to preclude the possible interference with air flow by fin supports 34 there is a series of diagonal recesses in each of the fin supports 34 in opposite directions on each side of the assembly 30 so that they meet at an apex 40 in each such fin support 34. The shape of the recesses 38 is best seen in FIG. 8. The ape configuration reduces air restriction where air flow is maximum while maintaining added thermal conductivity where heat flux is maximum.

In one particular version of the third embodiment of the invention shown in FIGS. 6–9, that version having been reduced to practice, the top plate 33 has the dimension of $4\frac{1}{4}$ inches long and $2\frac{1}{2}$ inches wide. The overall height of the assembly 30 is $1\frac{3}{4}$ inches with the thickness of the top plate 33 being $\frac{1}{4}$ inch. The distance between fin supports 34, as seen in FIG. 6, is $\frac{3}{8}$ inch and the thickness of the fin support 34 is $\frac{1}{8}$ inch. The fin material which is 0.002 thick copper, is $\frac{3}{8}$ inch wide and sufficiently long to provide a serpentine configuration as seen in FIG. 6 with the fin spacing corresponding to 32 repetitions per inch. The serpentine fin structure may optionally include slots or louvers to enhance heat transfer into the air stream. In this particular embodiment the thermal impedance is calculated to be 0.12 degrees C. per Watt at 40 cubic feet per minute of air flow. The total weight of the primary structure 32 is 1.94 pounds and the total weight of the fin structures is 1.2 pounds. It is presently contemplated that the third embodiment of the invention, namely assembly 30 illustrated in FIGS. 6–9, constitutes the best mode of practicing the invention. The cover plate, substantially identical to cover plate 14 of FIG. 1 is omitted in FIGS. 6–9 to better illustrate the structure. However, it will be understood that such a cover would be included. It will now be understood that what has been disclosed herein comprises a high performance forced air heat sink characterized by a novel split feed transverse flow configuration which reduces the air flow path, obviates the requirement for any form of air ducting, permits the use of the invention with a single blower, provides a uniform thermal impedance over the entire heat sink surface, permits a change in dimension of the heat sink in a direction perpendicular to air flow without affecting thermal impedance per unit length and enables using multiple heat sinks with a single blower while still obviating any need for ducting. Three different embodiments of the invention have been disclosed herein. The first two such embodiments differ only in the geometry of the fin structure required to assure both optimal thermal performance a well as good mechanical stability. One such fin structure is in the form of a honeycomb configuration and the other is in the form of a corrugated configuration. A third embodiment of the invention utilizes a fin structure similar to that of automobile radiators in that a serpentine configured thin copper sheet is utilized for the fin structure. The primary structure which supports the serpentine fins, utilizes both a top plate suitable for receiving a component thereon and a series of integral vertically extending fin supports to which the fin material may be bonded at regular intervals. The split feed transverse flow configuration reduces the thermal path between inlet and outlet and increases the air flow cross section while obviating any structure for air ducting such as manifolds or baffles. The resulting improvement in thermal efficiency reduces heat sink size approximately one order of magnitude which reduces the spacing between heat sinked components and therefore the cable length and inductance between such devices. In addition, the size of the enclosure may be reduced. The novel heat sink assembly of the present invention may be mounted in an enclosure adjacent an air inlet with a single blower mounted adjacent an air outlet.

Those having skill in the art to which the present invention pertains will now, as a result of the applicant's teaching herein, perceive various modifications and additions which may be made to the invention. By way of example, alternative materials, shapes and dimensions may be utilized for both the fin structure and the overall configuration of the assembly while still exploiting the essential feature of the invention, namely, the split feed transverse flow configuration. Accordingly, all such modifications and additions are deemed to be within the scope of the invention which is to be limited only by the claims appended hereto.

I claim:

1. A heat sink assembly of the type receiving an electrical component in intimate engagement for dissipating heat generated by such component, such heat dissipation being promoted by forced air flow through the assembly; the assembly comprising:
   a top plate having a first surface for receiving said component and a second surface for receiving fin structures;
   a plurality of fin structures each bonded to said second surface of said top plate and extending therefrom;
   at least two of said fin structures being in relative spaced relation to form an air inlet path therebetween whereby an air flow into said inlet between said two fin structures is divided, with a respective portion of said air flow being directed through each of said two fin structures; and
   a cover plate partially enclosing said fin structures and having an opening adjacent said air inlet;
   wherein said fin structures are formed of a serpentine structured material.

2. A heat sink assembly of the type receiving an electrical component in in intimate engagement for dissipating heat generated by such component, such heat dissipation being promoted by forced air flow through the assembly; the assembly comprising:
   a top plate having a first surface for receiving said component and a second surface for receiving fin structures;
   a plurality of fin structures each bonded to said second surface of said top plate and extending therefrom;
   at least two of said fin structures being in relative spaced relation to form an air inlet path therebetween whereby an air flow into said inlet between said two fin structures is divided, with a respective portion of said air flow being directed through each of said two fin structures; and
   a cover plate partially enclosing said fin structures and having an opening adjacent said air inlet;
   wherein said top plate is of a rectangular shape and each of said fin structures is of an elongated rectangular shape.

3. A forced air heat sink assembly comprising a thermally conductive planar member having a first surface for receiving a component to be cooled thereby and having a second surface; and
   at least two fin structures in intimate contact with said second surface and separated from each other to form a gap therebetween, said gap extending from said second surface and configured for receiving air flowing toward said second surface, dividing said air into two portions and directing each such portion through a separate fin structure for removing heat therefrom.

4. The assembly recited in claim 3 wherein said fin structures are formed of a honeycomb formed material.

5. The assembly recited in claim 3 wherein said fin structures are formed of a corrugated formed material.

6. The assembly recited in claim 3 wherein said fin structures are formed of a serpentine formed material.

7. The assembly recited in claim 3 wherein said planar member is an integral portion of said electrical component.

8. The assembly recited in claim 3 further comprising an enclosure having an inlet and an outlet, said gap between said fin structures being positioned adjacent said enclosure inlet.

9. The assembly recited in claim 3 further comprising a plurality of fin supports extending from said second surface of said planar member and forming a plurality of channels therebetween for receiving said fin structures.

10. The assembly recited in claim 6 further comprising a plurality of fin supports extending from said planar member and forming a plurality of channels for receiving said serpentine structured fin structures.

11. The assembly recited in claim 10 wherein each of said fin supports is recessed between said fin structures to promote air flow from said gap to each of said fin structures.

12. The assembly recited in claim 10 wherein each of said serpentine structured fin structures is bonded to said fin supports.

* * * * *